United States Patent
Deng et al.

(10) Patent No.: US 8,120,423 B2
(45) Date of Patent: Feb. 21, 2012

(54) OP-AMP SHARING WITH INPUT AND OUTPUT RESET

(75) Inventors: Liping Deng, Cupertino, CA (US); Tiejun Dai, Santa Clara, CA (US); Wei Zheng, San Jose, CA (US); Xueqing Wang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/960,858

(22) Filed: Dec. 6, 2010

(65) Prior Publication Data

US 2011/0148523 A1 Jun. 23, 2011

Related U.S. Application Data

(60) Provisional application No. 61/289,956, filed on Dec. 23, 2009.

(51) Int. Cl.
*H03F 1/02* (2006.01)

(52) U.S. Cl. .............. 330/9; 330/69; 330/147; 327/124; 327/307

(58) Field of Classification Search ................ 330/9, 69, 330/147; 327/124, 307
See application file for complete search history.

(56) References Cited

U.S. PATENT DOCUMENTS

| | | | |
|---|---|---|---|
| 5,990,707 A * | 11/1999 | Goldenberg et al. | 327/64 |
| 6,333,673 B2 * | 12/2001 | Dawes | 330/9 |
| 6,798,280 B2 * | 9/2004 | Rossi | 330/9 |
| 6,812,787 B2 * | 11/2004 | Kimura | 330/69 |
| 6,956,519 B1 * | 10/2005 | Huang et al. | 341/172 |
| 7,609,303 B1 * | 10/2009 | Lee et al. | 348/241 |
| 7,633,423 B2 * | 12/2009 | Cho | 341/161 |
| 7,733,168 B2 * | 6/2010 | Higuchi | 330/9 |
| 2011/0001649 A1 * | 1/2011 | Nakano | 341/155 |

* cited by examiner

*Primary Examiner* — Patricia Nguyen
(74) *Attorney, Agent, or Firm* — Lathrop & Gage LLP

(57) ABSTRACT

An operational amplifier with two pairs of differential inputs for use with an input switch capacitor network. The operational amplifier has reset devices for resetting the second pair of differential inputs while amplifying the first pair of differential inputs, and for resetting the first pair of differential inputs while amplifying the second pair of differential inputs for reducing memory effect in electronic circuits. In an embodiment, the amplifier has an additional reset device for resetting the outputs during a prophase of amplifying the first pair of differential inputs and a prophase of amplifying the second pair of differential inputs.

9 Claims, 3 Drawing Sheets

OP-AMP SHARING WITH INPUT AND OUTPUT RESET

CROSS-REFERENCE TO RELATED APPLICATIONS

The present application claims priority to U.S. Provisional Application Ser. No. 61/289,956, filed Dec. 23, 2009, incorporated herein by reference.

TECHNICAL FIELD

This disclosure relates generally to electronic circuits, and in particular, but not exclusively, is related to Switched Capacitor (SC) gain amplifiers and Pipelined Algorithmic Analog to Digital Converters (ADC).

BACKGROUND

Due to their relatively simple implementation and low cost in the application of intermediate speed and resolution, Pipelined Algorithmic Analog-to-Digital Converters (ADC) are found in various applications, including image sensors, communication and television. A component found at each stage of a Pipelined Algorithmic ADC is an operational amplifier (OP-AMP). The majority of the power consumption of a pipeline ADC is in the OP-AMPs, so OP-AMP sharing is desirable to minimize the number of OP-AMPs used. However, without the use of a reset phase in an OP-AMP sharing structure to eliminate residual signals from prior phases, amplification during a phase may be affected by a residue from a prior phase stored in capacitances of the OP-AMP input pair. This problem becomes more pronounced when a large or full-swing input signal exists, for example, when an image sensor pixel is exposed to bright light, resulting in a white pixel, that may either be converted improperly or may affect conversion of a following pixel. This is an example of a phenomenon known as the memory effect.

One method to reduce the occurrence of the memory effect in Pipeline ADCs is to insert a charge-reset phase between clock cycles. However, this has the effect of reducing the clock speed of the Pipeline ADC.

SUMMARY

An operational amplifier with two pairs of differential inputs for use with an input switch capacitor network. The operational amplifier has reset devices for resetting the second pair of differential inputs while amplifying the first pair of differential inputs, and for resetting the first pair of differential inputs while amplifying the second pair of differential inputs for reducing memory effect in electronic circuits. In an embodiment, the amplifier has an additional reset device for resetting the outputs during a prophase of amplifying the first pair of differential inputs and a prophase of amplifying the second pair of differential inputs.

In an embodiment, the operational amplifier has four inputs, a first and a second differential pairs, operational amplifier (OP-AMP) and outputs a single pair of differential output signals. Timing circuitry is provided for generating non-overlapping clocks. An input switched-capacitor (SC) network controlled by the non-overlapping clocks is configured such that the first pair of the differential input signals is amplified by the OP-AMP during a first phase, that the second pair of the differential input signals is amplified by the OP-AMP during a second phase. First input reset switch devices, coupled between signals of the first pair of differential input signals and a reference signal, and second input reset switch devices coupled between signals of the second pair of differential input signals and the reference signal, are provided to reset the amplifier inputs. In an embodiment, an additional reset device and signal is provided for resetting the amplifier output between amplification phases.

BRIEF DESCRIPTION OF THE DRAWINGS

The embodiments are more fully appreciated in connection with the following detailed description taken in conjunction with the accompanying drawings, in which like reference characters refer to like parts throughout.

DETAILED DESCRIPTION OF THE EMBODIMENTS

An embodiment of the disclosed switched capacitor (SC) gain amplifier with OP-AMP sharing with input and output reset is described herein. In the following description numerous specific details are set forth to provide a thorough understanding of the embodiments. One skilled in the relevant art will recognize, however, that the techniques described herein can be practiced without one or more of the specific details, or with other methods, components, materials, etc.

Rather than using OP-AMPs with one pair of differential inputs, the disclosed OP-AMP has two pairs of differential inputs, INP0-INN0 and INP1-INN1, thereby allowing for input reset as well as output reset without having to insert a separate reset phase between clock cycles of the OP-AMP. If a reset phase is inserted between clock cycles of the OP-AMP, the operation of a functional block using said OP-AMP—such as a pipelined algorithmic ADC—may not be optimal because of the time required for a separate reset phase. Utilizing the disclosed OP-AMP in a pipelined algorithmic ADC may allow an increase in the operating clock speed of the pipeline ADC.

In the present amplifier, the outputs of an SC network and differential inputs of the OP-AMP are reset using switches 113, 114, 113A, 114A, that selectively couple a pair of differential inputs together and to to a reference signal VREFC. The output of the OP-AMP is reset with an output reset switch 116 which selectively couples the signals VON, VOP of the differential output together.

Figure 1:
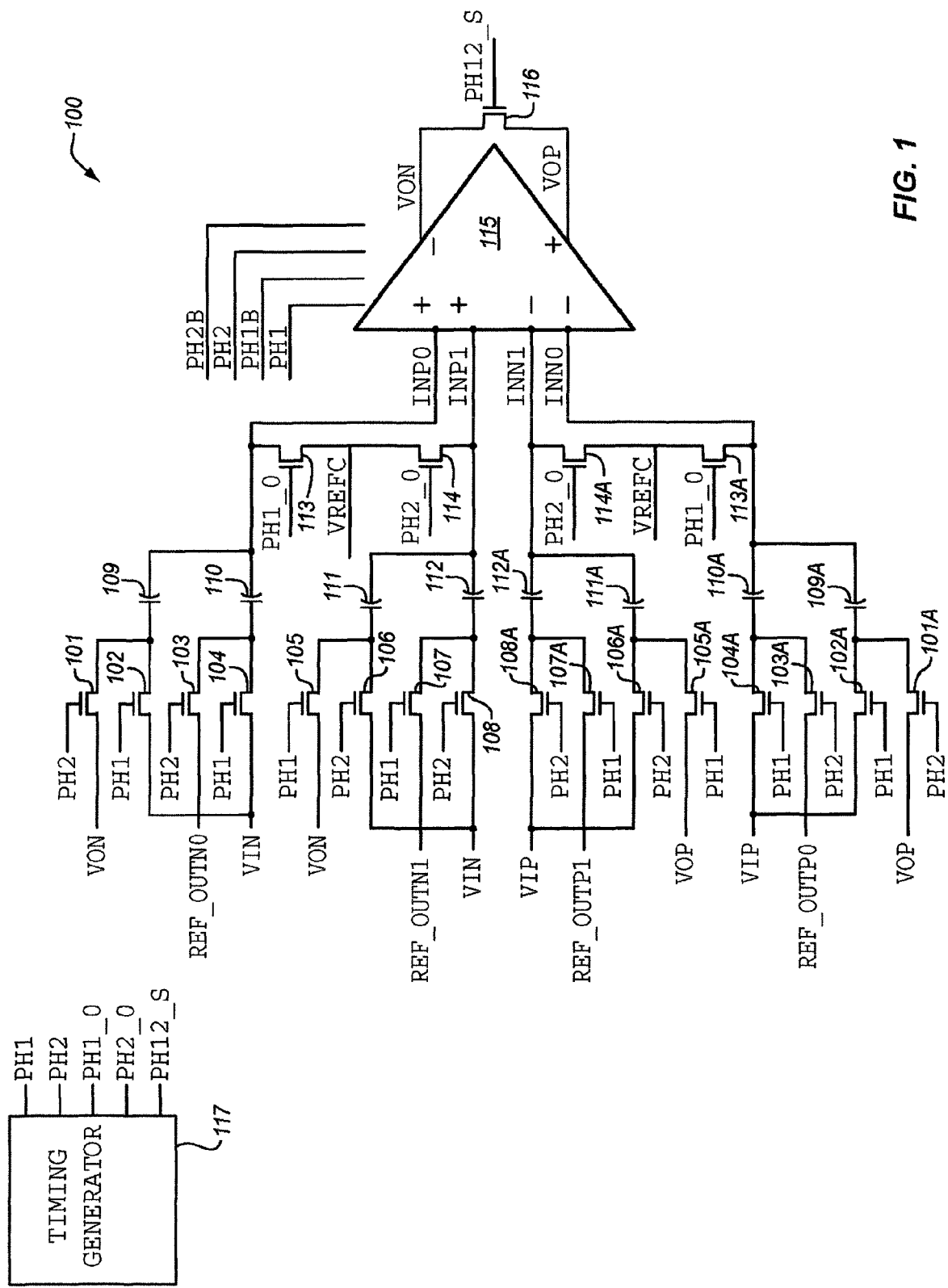
FIG. 1 illustrates the SC gain amplifier with OP-AMP sharing with input and output reset according to an embodiment of the present invention.
Figure 2:
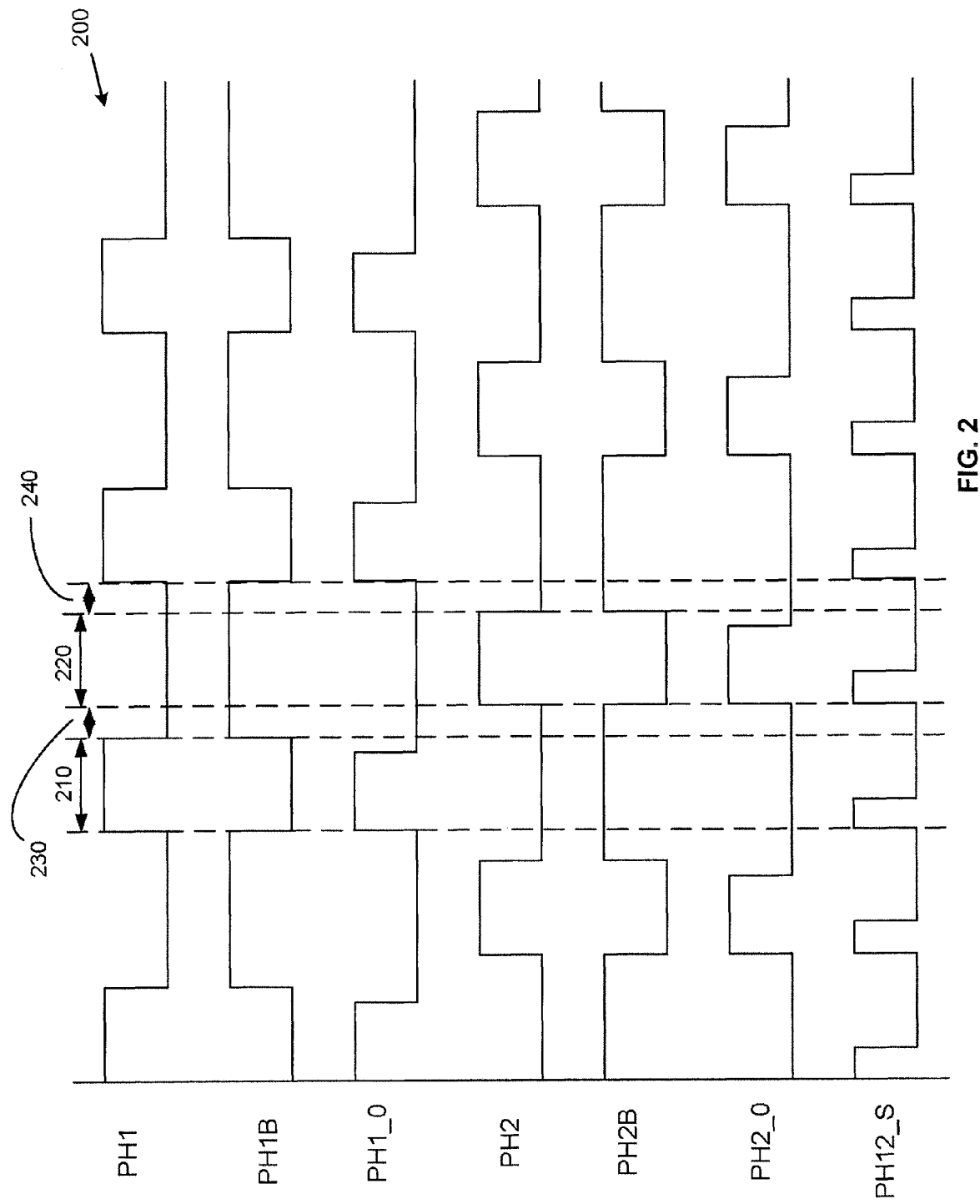
FIG. 2 illustrates the timing diagram of the SC gain amplifier and OP-AMP sharing with input and output reset according to an embodiment of the present invention.

The SC network is coupled to the inputs of the OP-AMP, and has two capacitors 111, 112, 111A, 112A, 109, 110, 109A, and 110A coupled to each input of the SC network, and a pair of switches 101, 102, 103, 104, 105, 106, 107, 108, 101A, 102A, 103A, 104A, 105A, 106A, 107A, 108A coupled to each capacitor. Each pair of switches is controlled by one of two phase-clock signals, PH1 and PH2 as illustrated in FIG. 1. The two phase-clock signals, PH1 and PH2, are non-overlapping as is illustrated in FIG. 2. Phase-clock signals PH1 and PH2 alternately sample differential input signals VIN and VIP into capacitors of the SC network in a first phase (220), and cause the amplifier to amplify the difference between the sampled differential input signals with the OP-AMP in a second phase (210). Similarly input signals VIN and VIP are sampled again into capacitors of the SC network in the second phase (210), and the difference between the sampled differential input signals is amplified by the OP-AMP in the following first phase (220), the first and second phases alternating. In both phases, gain is set by ratios of capacitances in the switched-capacitor network, such as ratios of capacitors 111 to 112, and 111A to 112A in the second phase, and similarly by ratios of capacitors 109 to 110 and 109A to 110A in the first phase.

Figure 3:
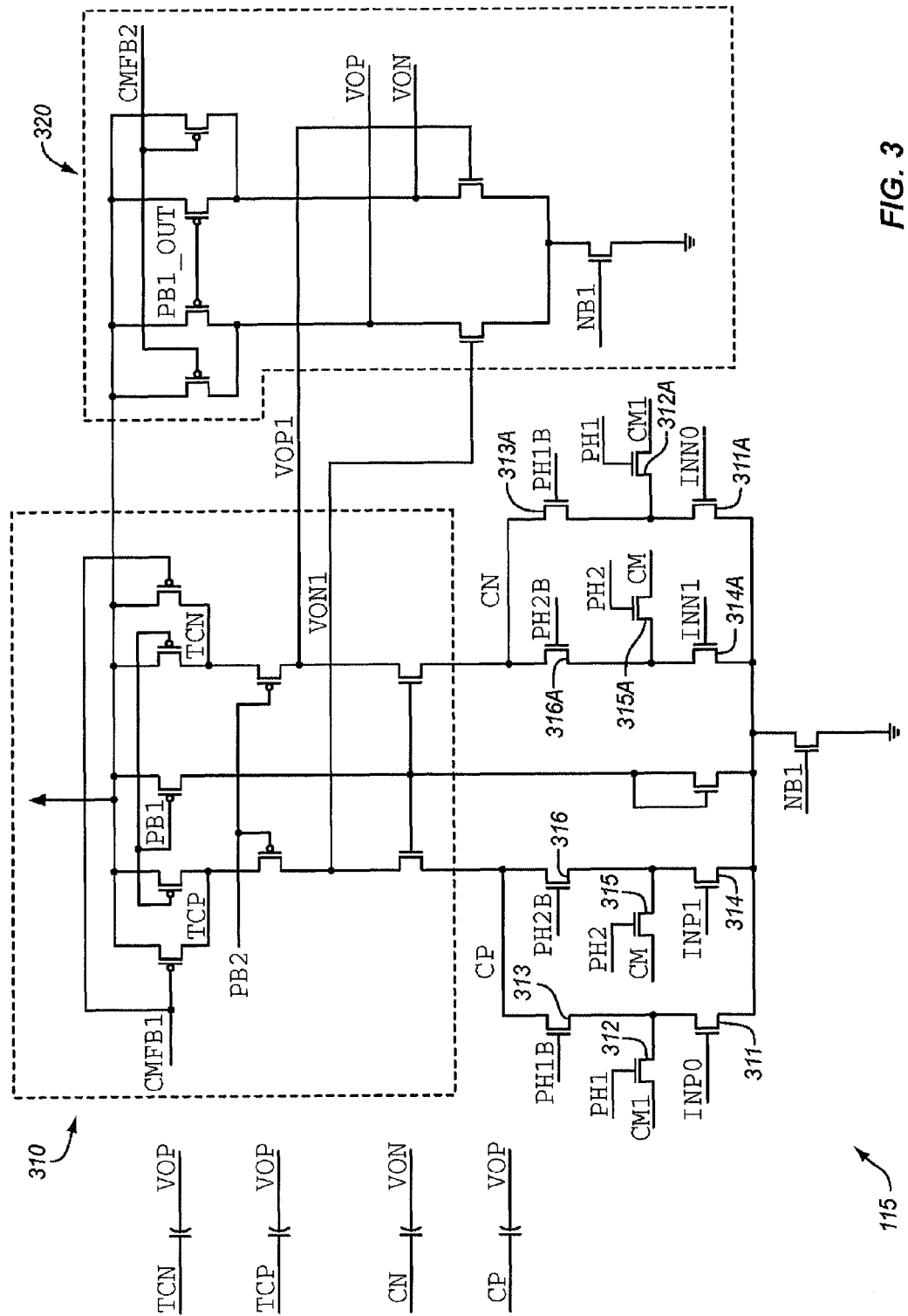
FIG. 3 illustrates the schematics of two-stage OP-AMP according to an embodiment of the present invention.

As can be seen in FIG. 3 with reference to FIG. 2, the INP0-INN0 differential signal pair from the SC network are amplified through differential pair 311, 311A and selected by selectors 313, 313A during the first phase (220) when PH1B is high, and the INP1-INN1 differential signal pair are amplified by differential pair 314, 314A and enabled by selectors 316, 316A, during the second phase (210) when PH2B is high. Similarly, first differential pair reset devices 312, 312A act to reset intermediate nodes between pair 311, 311A and selectors 313, 313A during the second phase when PH1 is high, and second differential pair reset devices 315, 315A act to reset intermediate nodes between pair 314, 314A and selectors 316, 316A during the first phase when PH2 is high Control signals PH1_0 and PH2_0 are also non-overlapping control signals, although PH1_0 overlaps PH1 and PH2_0 overlaps PH2. Non-overlapping control signals PH1_0 and PH2_0 reset a pair of differential inputs of the OP-AMP during a phase when the OP-AMP is not amplifying the sampled differential input signals.

In the present embodiment, as seen in FIG. 2, control signal PH1_0 is asserted when clock signal PH1 is asserted, and PH1_0 is de-asserted before the falling edge of clock signal PH1. Similar logic can be applied to control signal PH2_0 and clock signal PH2. In other embodiments control signal PH1_0 may be asserted before the rising edge of clock signal PH1, and/or may be de-asserted after the falling edge of clock signal PH1, as long as control signal PH1_0 does not overlap clock signal PH2. Again, similar logic can be applied to control signal PH2_0, which may be asserted before the rising edge of clock signal PH2, and/or may be de-asserted after the falling edge of clock signal PH2, as long as control signal PH2_0 is not asserted when clock PH1 is asserted. During each clock cycle, each pair of differential inputs of the OP-AMP is reset once, and the differential output of the OP-AMP is reset twice. An OP-AMP with two pairs of differential inputs allows for the frequent reset of its input and output without increasing the clock period of the OP-AMP.

In more detail, FIG. 1 illustrates a SC gain amplifier with OP-AMP sharing with input and output reset. OP-AMP 115 has two differential input pairs, INP0 and INN0 and INP1 and INN1. Note that since OP-AMP 115 is differential, only one side of the differential input pairs will be described. Each element in SC network coupled to a first differential input of OP-AMP 115 has a corresponding element coupled to a second differential input of OP-AMP 115. The first and second differential inputs make up one differential input pair. For example, switch 101 couples differential output signal VON to differential input INP0 of OP-AMP 115, switch 101A couples differential output signal VOP to differential input INN0 of OP-AMP 115. Similar logic can be applied to SC network elements 102A thru 114A.

Inputs INP0 and INP1 are connected to the SC subnetwork comprising switches 101-108 and capacitors 109-112. Two switches are connected to each capacitor, with switches 101 and 102 coupled to capacitor 109, switches 103 and 104 coupled to capacitor 110, switches 105 and 106 coupled to capacitor 111 and switches 107 and 108 coupled to capacitors 112, as shown in FIG. 1. Switches 101 thru 108 are controlled by non-overlapping clocks PH1 and PH2. Switches 113 and 114 connect either INP0 and INP1 respectively to reference signal VREFC to reset the signal. Switch 116 is coupled between the differential output, VON and VOP of OP-AMP 115.

When a signal is asserted, a switch which is controlled by that signal is closed, when the signal is deasserted, the switch which is controlled by that signal is open. In the present embodiment, the disclosed switches are NMOS transistors, and it can be appreciated that clock signals PH1 and PH2 and control signals PH1_0 and PH2_0 are active-high signals. In other embodiments of the invention, the disclosed switches which comprise the SC network may be PMOS transistors, in which case, clock signals PH1 and PH2, and control signals PH1_0 and PH2_0 are inverted to be active-low signals. In yet other embodiments of the present invention, the disclosed switches which comprise the SC network may be a combination of PMOS and NMOS transistors where clock signals which control the NMOS transistors are active-high and clock signals which control the PMOS transistors are active-low are used to obtain two non-overlapping phases for OP-AMP 115.

A phase with clock signal PH1 asserted and clock signal PH2 deasserted is seen in time interval 210 in FIG. 2. In this phase, switches 102 and 104 are closed, and input signal VIN is sampled and stored in capacitors 109 and 110. During this phase, control signal PH1_0 is asserted, and the OP-AMP input INP0 is reset with reference signal VREFC. Switches 105 and 107 are also closed, and OP-AMP 115, output VON, is sampled at capacitor 111, while a reference signal, REF_OUTN1 is sampled at capacitor 112. Capacitors 111 and 112, along with OP-AMP 115, form an SC gain amplifier having gain determined by a ratio of capacitance between capacitor 112 to capacitor 111. In the same phase, input signal VIN is sampled at capacitors 109 and 110. In the illustrated embodiment, control signal PH1_0 is de-asserted just before the falling edge of clock signal PH1. However, in other embodiments, control signal PH1_0 may be asserted before the rising edge of clock signal PH1, and/or de-asserted after the falling edge of clock signal PH1, as long as control signal PH1_0 is not asserted when clock signal PH2 is asserted.

An alternate phase with clock signal PH2 is asserted and clock signal PH1 is deasserted as seen in time interval 220 in FIG. 2, switches 106 and 108 are closed and input signal VIN is sampled and stored in capacitors 111 and 112. During this time, control signal PH2_0 is asserted, and the OP-AMP input INP1 is reset with reference signal VREFC. Switches 101 and 103 are also closed, signal VON is sampled at capacitor 109 and reference signal, REF_OUTN0 is sampled at capacitor 110. Capacitors 109 and 110, along with OP-AMP 115 form an SC gain amplifier. The differential input INP1 is reset with reference signal VREFC, while input signal VIN is sampled at capacitors 111 and 112. In the present embodiment, control signal PH2_0 is de-asserted just before the falling edge of clock signal PH2. Similar logic can be applied to control signal PH2_0, which may be asserted before the rising edge of clock signal PH2, and/or may be de-asserted after the falling edge of clock signal PH2, as long as control signal PH2_0 is not asserted when clock PH1 is asserted.

Clock signals PH1 and PH2 as well as their complements PH1B and PH2B control OP-AMP 115. A schematic showing representative circuitry of OP-AMP 115 can is illustrated in FIG. 3. The differential output of OP-AMP 115 is selectively reset by switch 116 which is controlled by reset signal PH12_S. Reset signal PH12_S is pulsed at the rising edge of either clock signals PH1 or PH2. The reset of the differential output signal at every rising edge of clock signals PH1 and PH2 is provided to reduce the output memory effect. The rising edge of reset signal may occur before the rising edge of either clock signals PH1 or PH2.

FIG. 2 illustrates an example of the timing of clock signals and control signals used in the SC network. In FIG. 2, the horizontal axis represents time and the vertical axis represents the amplitude of the signals. During time interval 210, control signal PH1_0 is asserted and differential input pair INP0 and INN0 are reset with reference signal VREFC. Clock signal PH1 is asserted, and clock signal PH2 is de-asserted during this time interval, differential input pair INP1 and INN1 amplifies a signal sampled by capacitors 111 and 112. Input signal VIN is sampled at capacitors 109 and 110. Before the falling edge of clock signal PH1, control signal PH1_0 is deasserted. When clock signal PH1 is de-asserted, time interval 230 begins, and during this time interval clock signals PH1 and PH2, as well as control signals PH1_0 and PH2_0 are de-asserted, during this time, and none of the switches in the SC network are closed.

During time interval 220, control signal PH2_0 is asserted and differential input pair INP1 and INN1 are reset with reference signal VREFC differential. Clock signal PH2 is asserted, and clock signal PH1 is de-asserted during this time interval, differential input pair INP0 and INN0 amplifies the signal sampled by capacitors 109 and 110 at time interval 210. Input signal VIN is sampled at capacitors 111 and 112. Before the falling edge of clock signal PH2, control signal PH2_0 is deasserted. When clock signal PH2 is de-asserted, time interval 240 begins, and during the brief non-overlap interval clock signals PH1 and PH2, as well as control signals PH1_0 and PH2_0 are de-asserted, and none of the switches in the SC network are closed.

As previously mentioned, control signal PH1_0 may be asserted before clock signal PH1 is asserted, in this case, time interval 240 may be shortened, or may not exist at all. Control signal PH1_0 also may be de-asserted after the falling edge of clock signal PH1; in this case, time interval 230 may be shortened, or may not exist at all, however some input offset error may be introduced by capacitive coupling associated with turning off these clocks if PH1_0 is not separate as illustrated. Similar logic may be applied to control signal PH2_0.

FIG. 3 illustrates the OP-AMP, 115 as seen in FIG. 1. OP-AMP 115 has two stages, telescopic OP-AMP stage 310 and common source OP-AMP stage 320. Signals CMFB1 and CMFB2 are common mode feedback signals for the first and second stage, 310 and 320 respectively and cascode compensation is used for stability. Differential output signals VON1 and VOP1 are the output of telescopic OP-AMP 310, and input of common source OP-AMP 320. Differential output signals VON and VOP are the output of the common source OP-AMP 320. Signals TCP, TCN, PB1, PB2, NB1 and PB1_OUT are bias voltage signals.

Transistors 311 and 311A form one differential input pair, INP0 and INN0, while transistors 314 and 314A form the second differential input pair, INP1 and INN1. When PH1 is asserted and PH2 is deasserted, transistors 311 and 311A are disconnected from the telescopic OP-AMP 310 and their drains are shorted via transistors 312 and 312A respectively. When PH2 is deasserted, locally inverted clock PH2B is asserted and transistors 314 and 314A are connected through transistor 316 and 316A to CP and CN respectively.

Recall in the previous discussion of FIG. 1, when PH1 is asserted, and PH2 is deasserted, the differential input pair INP0 and INN0 are reset with reference signal VREFC. Transistors 312 and 312A in FIG. 3 ensure that the drains of 311 and 311A are reset to further reduce residual voltages from prior amplifer phases and cycles. The overlapping timing of complementary clock signals PH1B and PH2B ensure that at least one pair of differential input INP0 and INN0 or INP1 and INN1 is coupled to the telescopic OP-AMP 310 at all times.

When PH2 is asserted and PH1 is deasserted, transistors 314 and 314A are disconnected from the telescopic OP-AMP 310 and the drains of transistors 314 and 314A are shorted via transistors 315 and 315A respectively. When PH1 is deasserted, locally inverted clock PH1B is asserted and transistors 311 and 311A are connected through transistors 313 and 313A to telescopic OP-AMP 310.

Recall in the previous discussion of FIG. 1, when PH2 is asserted, and PH1 is deasserted, the differential input pair INP1 and INN1 are reset with reference signal VREFC. Transistors 315 and 315A in FIG. 3 ensure that the drains of 314 and 314A are reset to further reduce residual voltages remaining in the amplifier from prior amplifier phases and cycles.

The advantages of having two pairs of differential inputs include a reduction of power consumption. Most of the power consumed by a Pipeline ADC goes to the OP-AMP, and by time-sharing telescopic amplifier 310 and common source amplifier 320, the overall power consumption of each stage of the Pipeline ADC can decrease. Transistors 313, 313A, 316 and 316A ensure that at least one pair of differential inputs, INP0 and INN0 or INP1 and INN1 is coupled to the telescopic OP-AMP 310 at all times. Another advantage of having two pairs of differential inputs is that a pair of differential inputs can be reset without inserting a full reset phase between clock cycles.

The output of OP-AMP 115 is the differential pair VON, VOP, as previously mentioned in FIG. 1. VON and VOP can be reset using switch 116 which is controlled by signal PH12_S. The signal PH12_S is pulsed at the rising edge of either PH1 or PH2, and the frequent reset of this output signal may reduce the occurrence of memory effect in image sensors.

It can be appreciated that this disclosure can be applied to other SC circuits using different amplifiers, such as one-stage OP-AMP or OP-AMPs with PMOS input pairs instead of the NMOS pairs illustrated. In the present embodiment, the switches 101-108 and 113 and 114 in FIG. 1 which make up the SC network are shown as NMOS transistors. The switches which comprise the SC network could be PMOS transistors, or complimentary switches having a combination of NMOS and PMOS transistors.

While the illustrated OP-AMP has two pairs of differential inputs, it can be appreciated that the OP-AMP may have three, or four, or more pairs of differential inputs. One of the advantages of an OP-AMP with three or more pairs of differential inputs is that three or more stages of a Pipeline ADC may share a single OP-AMP, and therefore reduce the power consumption of the Pipeline ADC. In the case of an OP-AMP with three or more pairs of differential inputs, the SC network will also need to be expanded to accommodate the additional pairs of inputs.

The foregoing description, for purposes of explanation, used specific nomenclature to provide a thorough understanding of the various embodiments. However, it will be apparent to one skilled in the art that specific details are not required in order to practice the embodiments as described. Thus, the foregoing descriptions of specific embodiments are presented for purposes of illustration and description. They are not intended to be exhaustive or to limit the embodiments to the precise forms disclosed; obviously, many modifications and variations are possible in view of the above teachings.

What is claimed is:

1. An amplifying apparatus comprising:
a four-input operational amplifier (OP-AMP); wherein
said four-input OP-AMP receives a first and a second pair of differential input signals and outputs a pair of differential output signals; wherein
each of the first and second pair of differential input signals comprises a first and a second signal;
timing circuitry for generating a first and a second non-overlapping clock;
an input switched-capacitor (SC) network controlled by the first and second non-overlapping clocks and configured such that the first pair of the differential input signals is amplified by the OP-AMP during a first phase, that the second pair of the differential input signals is amplified by the OP-AMP during the second phase, the first phase non-overlapping and alternating with the second phase;
first input reset switch devices coupled between the first signal and the second signal of the first pair of differential input signals and a reference signal, and second input reset switch devices coupled between the first signal and the second signal of the second pair of differential input signals and the reference signal; wherein
each of said input reset switches is controlled by a signal selected from the group consisting of a first and a second control signals;
and said first and second control signals are non-overlapping.

2. The apparatus of claim 1 further comprising an output reset switch device controlled by a third clock, the output reset switch device coupled between said pair of differential output signals to selectively couple said pair of differential output signals; and wherein the timing circuitry generates the third clock to enable the reset switch during a prophase of both the first phase and the second phase.

3. The apparatus of claim 1 wherein the timing circuitry further generates the first and second control signals, wherein the first control signal is active during at least a portion of the second phase, and the second control signal is active during at least a portion of the first phase.

4. The apparatus of claim 1, 2, or claim 3, wherein:
said four-input OP-AMP comprises:
a first transistor having a gate for coupling to a first differential input signal of the first pair of differential input signals;
a second transistor having a gate for coupling to a second differential input signal of the first pair of differential input signals;
a third transistor having a gate for coupling to a first differential input signal of the second pair of differential input signals; and
a fourth transistor having a gate for coupling to a second differential input signal of the second pair of differential input signals;
said OP-AMP is configured and arranged such that a drain of each transistor is reset when a reference signal is applied to the gate of the transistor.

5. The apparatus of claim 4 wherein a source of the first, second, third and fourth transistor are coupled together to a current source.

6. The apparatus of claim 5 wherein:
the drain of the first transistor is coupled to a source of a first switching transistor, the drain of the second transistor is coupled to a source of a second switching transistor, the drain of the third transistor is coupled to a source of a third switching transistor, the drain of the fourth transistor is coupled to a source of a fourth switching transistor; and
wherein a gate of the second switching transistor is coupled to a gate of the first switching transistor and to a clock active during the first phase, and wherein a gate of the third switching transistor is coupled to a gate of the fourth switching transistor and to a clock active during the second phase.

7. The apparatus of claim 1 or claim 3, wherein:
said four-input OP-AMP comprises:
a telescopic OP-AMP stage,
a first differential input pair for coupling said first pair of differential input signals to an input pair of said telescopic OP-AMP stage, and
a second differential input pair for coupling said second pair of differential input signals to said input pair of said telescopic OP-AMP stage;
said four-input OP-AMP is configured and arranged such that at least one of said first and second differential input pairs is connected to said input pair of said telescopic OP-AMP at all times during operation of the apparatus.

8. A method of amplifying a first differential pair of signals and a second differential pair of signals comprising:
Applying the first differential signal to a first differential pair, and selecting the first differential pair as an active input pair of a differential amplifier;
Amplifying the first differential signal to provide a first amplified output on differential output signals;
Applying the second differential signal to a second differential pair, and selecting the second differential pair as the active input pair of the differential amplifier;
Resetting the output signals to eliminate residual effects of the first amplified output;
Resetting the first differential pair;
Amplifying the second differential signal to provide a second amplified output on the differential output signals;
Resetting the second differential pair; and
Resetting the output signals to eliminate residual effects of the second amplified output.

9. The method of claim 8 further comprising using feedback from the differential output signals to a switched capacitor network having gain capacitors to determine a gain of the step of amplifying the first differential signal; and using feedback from the differential output signals to the switched capacitor network to determine a gain of the step of amplifying the second differential signal.

* * * * *